(12) United States Patent
Camuffo et al.

(10) Patent No.: US 8,908,751 B2
(45) Date of Patent: Dec. 9, 2014

(54) JOINT ADAPTIVE BIAS POINT ADJUSTMENT AND DIGITAL PRE-DISTORTION FOR POWER AMPLIFIER

(75) Inventors: Andrea Camuffo, Munich (DE); Chi-Tao Goe, Neubiberg (DE); Bernhard Sogl, Unterhaching (DE); Sandro Pinarello, Munich (DE); Jan-Erik Mueller, Ottobrunn (DE); Nick Shute, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 956 days.

(21) Appl. No.: 13/036,758

(22) Filed: Feb. 28, 2011

(65) Prior Publication Data

US 2012/0219048 A1 Aug. 30, 2012

(51) Int. Cl.

| | | |
|---|---|---|
| *H04B 3/46* | (2006.01) | |
| *H03F 3/21* | (2006.01) | |
| *H03F 1/32* | (2006.01) | |
| *H03F 1/02* | (2006.01) | |
| *H03F 3/72* | (2006.01) | |
| *H03F 1/24* | (2006.01) | |
| *H04B 1/04* | (2006.01) | |

(52) U.S. Cl.
CPC .............. *H04B 1/0475* (2013.01); *H03F 3/211* (2013.01); *H03F 1/3247* (2013.01); *H03F 2203/7236* (2013.01); *H03F 1/0277* (2013.01); *H03F 3/72* (2013.01); *H03F 2201/3233* (2013.01); *H03F 1/0255* (2013.01); *H03F 1/24* (2013.01); *H04B 2001/0425* (2013.01); *H03F 2203/7215* (2013.01); *H03F 2200/321* (2013.01)
USPC ........... 375/224; 375/296; 375/278; 455/126; 455/114.2; 455/127.1

(58) Field of Classification Search
CPC ............................ H04B 1/0475; H03G 3/3042
See application file for complete search history.

(56) References Cited

U.S. PATENT DOCUMENTS 6,252,912 B1 * 6/2001 Salinger ................. 375/278
6,819,171 B2 11/2004 Kenington
(Continued)

FOREIGN PATENT DOCUMENTS

| CN | 101635697 A | 1/2010 |
|---|---|---|
| CN | 101764580 A | 6/2010 |

(Continued)

OTHER PUBLICATIONS

U.S. Appl. No. 12/886,833, filed Sep. 21, 2010.

(Continued)

*Primary Examiner* — Leon-Viet Nguyen
(74) *Attorney, Agent, or Firm* — Eschweiler & Associates, LLC

(57) ABSTRACT

One embodiment of the present invention relates to a method and apparatus are provided herein for reducing the power consumption of a transmission chain while maintaining an acceptable figure of merit (e.g., linearity). In one embodiment, an adaptive biasing element is configured to perform adaptive biasing to reduce current consumption of a transmission chain by adjusting the operating point of one or more transmission chain elements (e.g., power amplifier, mixer, etc.). However, since adaptive biasing may reduce the linearity of a transmitted signal, its use is limited by the degradation of figure of merit caused by the introduced non-linearities. Accordingly, a pre-distortion element may be configured to perform adaptive digital pre-distortion (DPD) on a transmission chain input signal to account for non-linearities generated through the adaptive biasing, therefore allowing the adaptive biasing to further reduce the current consumption while maintaining an acceptable figure of merit.

18 Claims, 8 Drawing Sheets

(56) References Cited

U.S. PATENT DOCUMENTS

| | | | |
|---|---|---|---|
| 7,203,511 B2 | 4/2007 | Trachewsky et al. | |
| 7,656,227 B1 | 2/2010 | Beaudoin et al. | |
| 8,351,875 B2* | 1/2013 | Kato et al. | 455/114.2 |
| 8,364,103 B2* | 1/2013 | Pinarello et al. | 455/126 |
| 2004/0095193 A1* | 5/2004 | Krvavac | 330/285 |
| 2004/0235438 A1 | 11/2004 | Quilisch et al. | |
| 2006/0158254 A1* | 7/2006 | Johnson et al. | 330/149 |
| 2007/0153884 A1* | 7/2007 | Balasubramanian et al. | 375/221 |
| 2009/0295483 A1 | 12/2009 | Alidio et al. | |
| 2010/0097143 A1* | 4/2010 | Eken et al. | 330/278 |
| 2011/0260797 A1 | 10/2011 | Lee | |

FOREIGN PATENT DOCUMENTS

| | | |
|---|---|---|
| DE | 10120514 A1 | 10/2002 |
| DE | 102004047684 A1 | 6/2005 |
| WO | 0001065 A1 | 1/2000 |
| WO | 2010019601 A1 | 2/2010 |
| WO | 2010126907 A1 | 11/2010 |

OTHER PUBLICATIONS

Carrara, Franscesco, et al., "A 2.4-GHz 24-dBm SOI CMOS Power Amplifier with Fully Integrated Reconfigurable Output Matching Network", IEEE Transactions on Microwave Theory and Techniques, vol. 57, No. 9, Sep. 2009, p. 2122-2130.

Presti, Calogero D., et al., "A 25 dBm Digitally Modulated CMOS Power Amplifier for WCDMA/EDGE/OFDM with Adaptive Digital Predistortion and Efficient Power Control", IEEE Journal of Solid-State Circuits, vol. 44, No. 7, Jul. 2009, p. 1883-1896.

Non-Final Office Action dated Mar. 12, 2012 to U.S. Appl. No. 12/886,833.

Notice of Allowance dated Sep. 25, 2012 for U.S. Appl. No. 12/886,833.

Final Office Action dated Jul. 17, 2012 for U.S. Appl. No. 12/886,833. 20 Pages.

* cited by examiner

US 8,908,751 B2

JOINT ADAPTIVE BIAS POINT ADJUSTMENT AND DIGITAL PRE-DISTORTION FOR POWER AMPLIFIER

BACKGROUND OF THE INVENTION

Modern portable communication devices (e.g., cell phones, PDAs, etc.) comprise a transmission chain configured to transmit radio frequency (RF) signals. The transmission chain typically may comprise a plurality of elements including a low noise amplifier, a modulation circuit (e.g., mixer), a filter, and a power amplifier. The power amplifier is configured to convert a modulated, filtered input signal with a small amount of energy into an output signal with a larger amount of energy. Efficiency and linearity are both factors in the performance of power amplifiers in modern wireless systems.

Adaptive digital pre-distortion (DPD) may be used to improve the quality of a signal by linearizing the non-linear response of a power amplifier. DPD is generally performed on a signal prior to modulation to generate a distorted version of the signal to be modulated. The distortion version of the signal has an inverse response of the power amplifier so as to account for distortion introduced by the power amplifier (i.e., so that the overall response of the power amplifier is linear). Therefore, the pre-distortion removes/reduces amplitude (AM/AM) and phase (AM/PM) non-linearities introduced by the power amplifier.

DETAILED DESCRIPTION OF THE INVENTION

Figure 1:
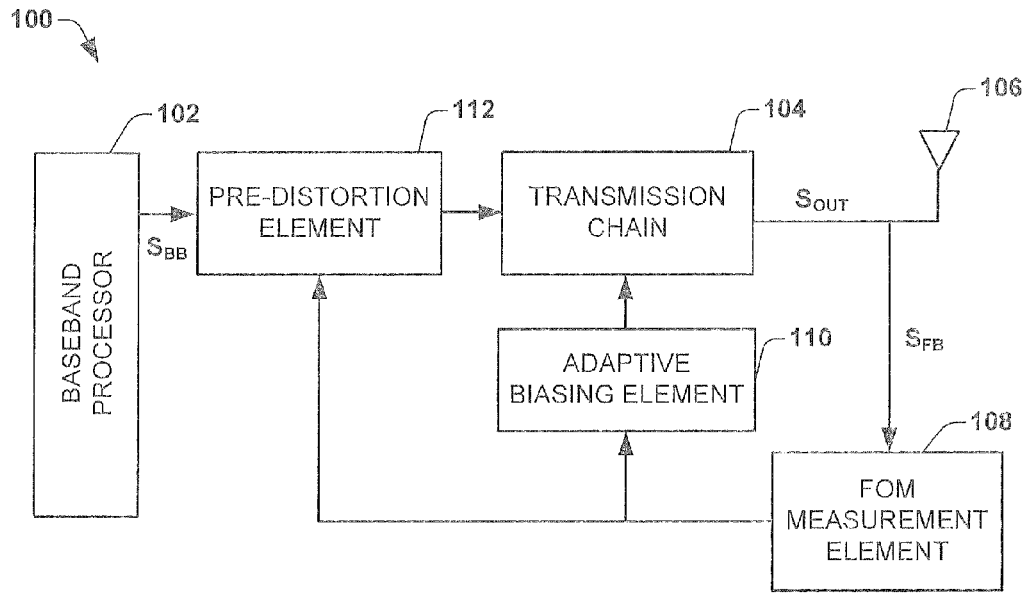
FIG. 1 illustrates a block diagram of a first embodiment of a transmission circuit configured to optimize the power consumption of a transmission chain while maintaining an acceptable output figure of merit using adaptive biasing and digital pre-distortion.

The present invention will now be described with reference to the attached drawing figures, wherein like reference numerals are used to refer to like elements throughout, and wherein the illustrated structures and devices are not necessarily drawn to scale.

Power consumption is an important design concern for modern mobile communication devices (e.g., cell phones, PDA, etc.). Low power consumption allows for a number of improvements to a mobile communication device including increased performance, expanded functionality, and longer operating time. In mobile phone transmitters, the current consumed by a transmission chain comprises a large source of overall power consumption. Accordingly, a method and apparatus for reducing the power consumption of a transmission chain is provided herein.

The method and apparatus, provided herein, reduce the power consumption of a transmission chain while maintaining an acceptable figure of merit (e.g., linearity). In various embodiments, the method and apparatus may comprise alternatively and/or concurrently performing adaptive biasing of one or more transmission chain elements and pre-distortion of a transmission chain input signal to compensate for non-linearities, based upon feedback information associated with an output signal.

For example, in one embodiment, an adaptive biasing element is configured to perform adaptive biasing to reduce current consumption of a transmission chain by adjusting the operating point (e.g., by changing the collector voltage/bias current applied to transmission chain elements) of one or more transmission chain elements (e.g., power amplifier, mixer, etc.). However, since adaptive biasing may reduce the linearity of a transmitted signal, its use is limited by the degradation of figure of merit caused by the introduction of non-linearities. Accordingly, a pre-distortion element may be configured to perform adaptive digital pre-distortion (DPD) on a transmission chain input signal to account for non-linearities generated through the adaptive biasing, therefore allowing the adaptive biasing to further reduce the current consumption while maintaining an acceptable figure of merit.

In one particular embodiment, a transmission circuit configured to dynamically adjust an operating point of one or more transmission chain elements, to optimize current consumption and transmission quality, is provided herein. The transmission circuit comprises a transmission chain having a plurality of elements configured to generate a signal that is output from the transmission chain. A feedback loop provides signal information about the output signal (e.g., phase, amplitude, etc.) to a figure of merit (FOM) measurement element, which utilizes the signal information to evaluate a measured figure of merit of the output signal. Based upon the measured figure of merit, an adaptive biasing element and a pre-distortion element are configured to perform (e.g., alternatively, concurrently) adaptive biasing of one or more transmission chain elements and pre-distortion of the signal input to the transmission chain, to reduce the power consumption of the transmission circuit.

It will be appreciated that as provided herein, the term "adaptive biasing" may include any means of adaptively changing the current consumption of one or more transmission chain elements based upon information associated with an output signal of the transmission chain. For example, in one non-limiting embodiment, adaptive biasing may comprise iteratively changing biasing conditions such as the collector voltage and/or the biasing current of a transmission chain element based upon information associated with the output signal. In another non-limiting embodiment, adaptive biasing may comprise iteratively adjusting the active area (e.g., the number of active transistor cells) of a power amplifier within the transmission chain to minimize the power amplifier's current consumption.

Furthermore, although the value of the measured figure of merit is described herein as increasing when the actual merit (e.g., real "goodness" of a signal) decreases, this is a non-limiting embodiment of the present invention. For example, in some alternative embodiments, measured figures of merit may decrease/increase when the actual merit decreases/increases. Such alternative measured figure of merit would maintain a high actual merit by keeping the measured figure of merit above a predetermined threshold value.

FIG. 1 illustrates a block diagram of a first embodiment of a transmission circuit 100 configured to optimize the power consumption of a transmission chain 104 while maintaining an acceptable output signal figure of merit using adaptive biasing and digital pre-distortion (DPD). The transmission circuit 100 comprises a transmission chain 104 disposed between a signal processor 102 (e.g., baseband processor) and an antenna 106. In one embodiment, the signal processor comprises a baseband processor 102 configured to output a baseband signal $S_{BB}$ to transmission chain 104. The transmission chain 104 is configured to generate an output signal $S_{OUT}$ (e.g., a modulated RF output signal) that is provided to an antenna 106 for transmission.

The transmission circuit 100 also comprises a feedback loop extending from the output of the transmission chain 104 to a figure of merit (FOM) measurement element 108. The feedback loop provides a feedback signal $S_{FB}$, comprising information about the output signal $S_{OUT}$ (e.g., phase, amplitude, etc.), to the FOM measurement element 108, which may execute an algorithm that evaluates signal properties of the output signal and generates a measured figure of merit, based upon the feedback signal $S_{FB}$.

The FOM measurement element 108 is coupled to an adaptive biasing element 110 and a pre-distortion element 112. The adaptive biasing element 110 is configured to perform adaptive biasing of one or more transmission chain elements. The pre-distortion element 112 is configured to selectively perform pre-distortion on the baseband signal $S_{BB}$ output from the baseband processor 102 (i.e., the signal input into the transmission chain 104) by updating one or more pre-distortion coefficients. In one embodiment, the adaptive biasing element 110 and the pre-distortion element 112 are configured to operate in an alternating manner to reduce the power consumption of the transmission circuit 100. In an alternative embodiment, the adaptive biasing element 110 and the pre-distortion element 112 are configured to operate concurrently (e.g., in a same time slot) to reduce the power consumption of the transmission circuit 100.

In one embodiment, the adaptive biasing element 110 may be operated to slowly adapt biasing conditions to reduce the current consumption of one or more transmission chain elements in a step-wise iterative manner. Since adaptive biasing (e.g., adapting biasing conditions) may reduce the linearity of a transmitted signal, after each step-wise reduction in current consumption the FOM measurement element 108 may measure the figure of merit of the output signal $S_{OUT}$. Based upon the measured figure of merit, the adaptive biasing element 110 may perform another step-wise reduction in current consumption and/or the pre-distortion element 112 may generate a distorted version of the signal input to the transmission chain to reduce non-linearities introduced by the adaptive biasing element 110.

For example, in one embodiment the adaptive biasing element 110 may perform adaptive biasing to continually reduce the current consumption of the one or more transmission chain elements, uninterrupted by the pre-distortion element 112, until adaptive biasing has reduced the actual merit of the output signal $S_{OUT}$ to a measured figure of merit that violates a predetermined quality standard (e.g., has an actual merit within a predetermined target range). At such a time, the pre-distortion element 112 may be operated to improve the linearity of the output signal $S_{OUT}$ by generating a distorted version of the signal input to the transmission chain (e.g., using a LUT), thereby improving the figure of merit of the output signal $S_{OUT}$ so that it does not violate the predetermined quality standard. In one embodiment, the distorted signal may have an inverse response of the adaptive biasing element so as to account for distortion (e.g., non-linearities) introduced by the adaptive biasing element.

In an alternative embodiment, the adaptive biasing element 110 may be operated to perform adaptive biasing to reduce the current consumption of one or more transmission chain elements in a step-wise iterative manner. After each step-wise reduction in current consumption, the FOM measurement element 108 may measure the figure of merit of the output signal $S_{OUT}$ and the pre-distortion element 112 may operate to improve the figure of merit (e.g., linearity) of the output signal, by generating a distorted version of the signal input to the transmission chain in response to the figure of merit reduction caused by the reduction in current consumption due to adaptive biasing. Therefore, in such an embodiment each stepwise reduction in current consumption made by the adaptive biasing element 110 is followed by the pre-distortion element 112 generating an updated distorted version of the signal input to the transmission chain 104 (e.g., performing an update to pre-distortion coefficients).

It will be appreciated that the above embodiments, illustrating an order of operation for the adaptive biasing element 110 and the pre-distortion element 112, are non-limiting embodiments. The inventors have appreciated that variations on these orders are contemplated as falling within the invention. For example, the adaptive biasing element 110 may be operated to perform two or more consecutive step-wise reductions in current consumption (separated by a measurement of the figure of merit) between the pre-distortion element 112 being operated to generate an updated distorted version of the signal input to the transmission chain. Alternatively, the adaptive biasing element 110 and the pre-distortion element 112 may be operated concurrently to generate an updated distorted version of the signal input to the transmission chain.

Therefore, as shown in FIG. 1, a transmission circuit 100 comprises an adaptive biasing element 110 and a pre-distortion element 112, configured to alternatively operate to reduce the current consumption of the transmission chain 104 while maintaining an acceptable output signal figure of merit.

Figure 2:
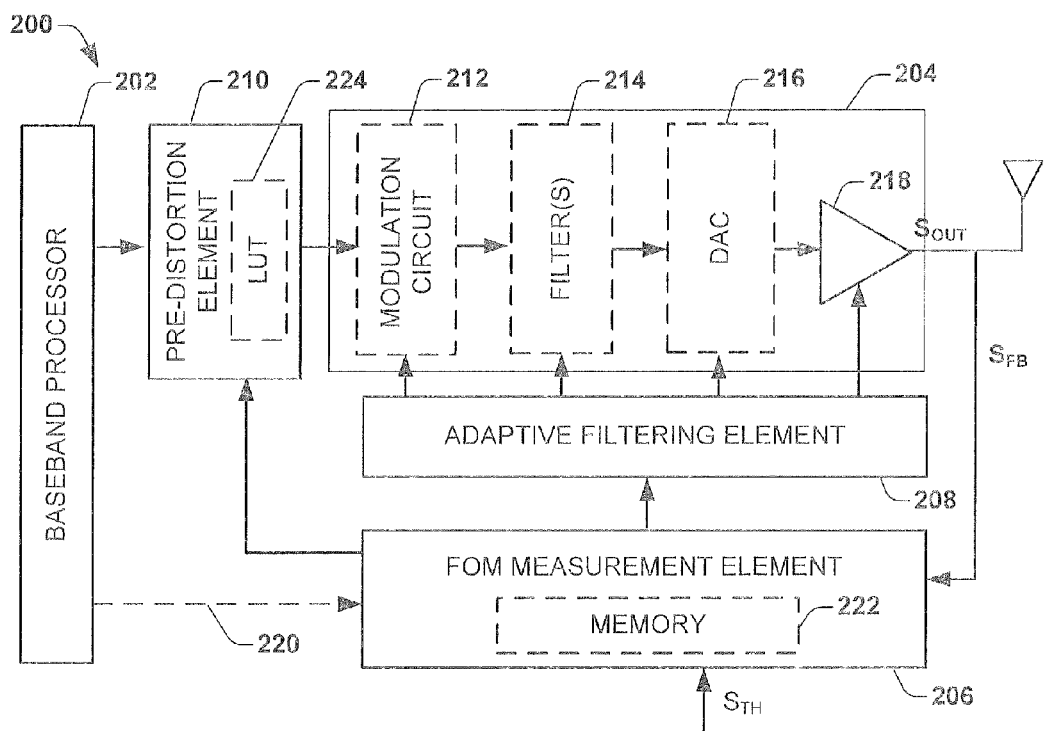
FIG. 2 illustrates a block diagram of a more detailed exemplary embodiment of a transmission circuit configured to optimize the power consumption of a transmission chain while maintaining an acceptable output figure of merit using adaptive biasing and digital pre-distortion.

FIG. 2 illustrates a block diagram of a more detailed exemplary embodiment of a transmission circuit 200 configured to optimize the power consumption of a transmission chain while maintaining an acceptable output signal figure of merit using adaptive biasing and digital pre-distortion.

As shown in FIG. 2, the transmission chain 204 may comprise a number of components, including but not limited to, a modulation circuit 212, one or more filters 214, a digital-to-analog converter (DAC) 216, and a power amplifier 218. In various embodiments, the transmission chain 204 may also comprise a wide range of additional elements depending on considerations such as modulation type. In various embodiments, the method and apparatus for reducing power consumption can be individually applied to each of the individual elements in the transmission chain 204 or may be applied in concert to a plurality of the elements in the transmission chain 204.

In one embodiment, a figure of merit (FOM) measurement element 206 may comprise a memory 222, configured to store an algorithm that may be executed to utilize information provided by a feedback signal $S_{FB}$ to determine a measured figure of merit of an output signal $S_{OUT}$. In one embodiment, the measured figure of merit may be determined by analyzing a crest factor of the feedback signal $S_{FB}$ and comparing it to a crest factor of the input signal (provided by line 220).

The measured figure of merit may be compared to a predetermined quality standard (e.g., associated with a transmission standard). In one embodiment, the predetermined quality standard may comprise a first predetermined threshold value $S_{TH\_1}$. In such an embodiment, if the measured figure of merit violates the first predetermined threshold value (e.g., is above the first predetermined threshold value) the pre-distortion element will operate to distort the incoming signal and improve the figure of merit (e.g., reduce the value of the figure of merit), while the adaptive biasing element 208 will continue to operate to reduce the current consumption (e.g., figure of merit). For example, if a comparison between the measured figure of merit and first predetermined threshold value $S_{TH\_1}$ indicates that the actual merit is worse than the first predetermined threshold value $S_{TH\_1}$, non-linearities introduced by adaptive biasing can be removed by generating a distorted version of the signal input to the transmission chain 204.

In an additional embodiment, the predetermined quality standard may further comprise a second predetermined threshold value embodiment $S_{TH\_2}$. In one embodiment, if the measured figure of merit violates the second predetermined threshold value (e.g., is above the second predetermined threshold value) the adaptive biasing element 208 will operate to dynamically adjust the operating point (e.g., bias conditions) of the one or more elements in the transmission chain 204 to improve the actual merit (e.g., reduce the measured figure of merit). For example, if a comparison between the measured figure of merit and second predetermined threshold value $S_{TH\_2}$ indicates that the actual merit is worse than the second predetermined threshold value $S_{TH\_2}$ the actual merit can be improved by adaptively biasing elements within the transmission chain to achieve a better figure of merit for the output signal $S_{OUT}$.

Therefore, the first and second predetermined threshold values $S_{TH\_1}$, $S_{TH\_2}$ collectively comprise a predetermined target range that defines a range of actual merit extending from $S_{TH\_1}$ to $S_{TH\_2}$. If the measured figure of merit indicates that the actual merit is better than that defined by the predetermined target range, the operating point (e.g., biasing conditions) of the one or more transmission chain elements may be reduced in a stepwise manner, thereby reducing the current consumption and making the measured figure of merit worse. If the measured figure of merit indicates that the actual merit is within the predetermined target range, the non-linearities introduced by the adaptive biasing are evaluated and the one or more pre-distortion coefficients used to generate a distorted input signal may be updated. And, if the measured figure of merit indicates that the actual merit is worse than the predetermined target range, the biasing conditions may be increased, thereby increasing the current consumption and the measured figure of merit.

As provided herein, measured figure of merit (FOM) may comprise a numeric value indicative of the actual merit of an output signal $S_{OUT}$. In various embodiments, the figure of merit of the output signal may be measured according to a variety of different ways. For example, in one embodiment, the figure of merit of the output signal may be measured directly, by comparing a demodulated RF feedback signal (e.g., the crest factor of the signal at the output of the power amplifier) with a reference signal (e.g., the crest factor of the signal at the input of the power amplifier provided by line 220). In an alternative embodiment, the figure of merit of the output signal may be measured indirectly, by evaluating the AM/AM and AM/PM distortion introduced by a power amplifier. In yet another embodiment, the adjacent channel leakage ratio (ACLR) can be measured and used as an indicator of the figure of merit (e.g., a low ACLR indicates a high figure of merit and a high ACLR indicates a low figure of merit).

Furthermore, the adaptive system may make use of "hard" threshold values and/or may have an "analog" response to the value of the figure of merit. The hard threshold values may comprise one or more predetermined threshold values that the adaptive biasing and digital pre-distortion (DPD) strictly conform to. The "analog mode" may comprise one or more predetermined threshold values that the adaptive biasing and digital pre-distortion (DPD) may use to determine the amount of adaptive biasing and/or DPD that may be used (e.g., the amount of adaptive biasing and/or DPD may be based upon a difference between the measured figure of merit and a predetermined threshold value). For example, the amount of adaptive biasing and/or DPD may be calculated through mathematical relationships involving the value of the figure of merit and other parameters, which could be constant tailored to the specific transmission chain or values derived by specific sensors (e.g., temperature sensors, etc.) configured to measure external variables used to assist determining the measured figure of merit.

In one embodiment, the predetermined threshold values may comprise one or more values determined from lab measurements to comprise a safety threshold value that allows the transmission circuit to operate in a condition safe enough to guarantee good modulation quality under various circumstances. In another embodiment, the one or more of the predetermined threshold values may be set below a system specification so that no violations of communication standards (e.g., a minimum transmission signal power) occur. In an additional embodiment, the predetermined threshold values may allow for different threshold values according to the output power and/or type of modulation being used.

Figure 3:
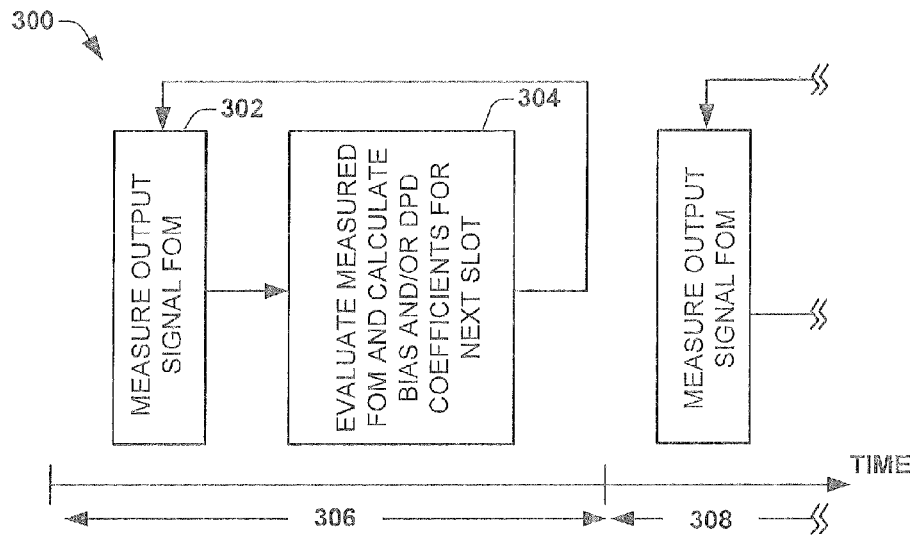
FIG. 3 illustrates operation of a figure of merit (FOM) measurement circuit, as provided herein, within consecutive time slots.

In one embodiment, shown in FIG. 3, operation of the figure of merit measurement element may be selectively performed within consecutive time slots. In particular, FIG. 3 illustrates operation of a figure of merit (FOM) measurement element (e.g., corresponding to FOM measurement element 108 or 206) within a time slot 306. At 302 a figure of merit of an output signal is measured. At 304, the measured data is evaluated and used to adaptively bias transmission chain elements and/or generate updated pre-distortion coefficients. In one embodiment, adaptive biasing may be performed in alternative time slots with respect to updating pre-distortion coefficients. In an alternative embodiment, adaptive biasing and updating the pre-distortion coefficients may be done in the same time slot (e.g., at the same time). As shown in FIG. 3, the method may be repeated within successive timeslots (e.g., in time slot 306, in time slot 308, etc.).

In one embodiment, the figure of merit of an output signal may be continuously evaluated within a predetermined number of time slots (e.g., each time slot, every other time slot, etc.) and the current consumption may be adjusted accordingly. In other words, the system will continuously monitor the output signal to ensure the figure of merit remains within a target range. Such continuous monitoring allows adjustments to be made to the figure of merit (e.g., through adaptive biasing and/or digital pre-distortion) in response to changing conditions (e.g., temperature changes, voltage standing wave ratio changes, etc.) that may cause the measured figure of merit to rise above the predetermined threshold.

Figure 4:
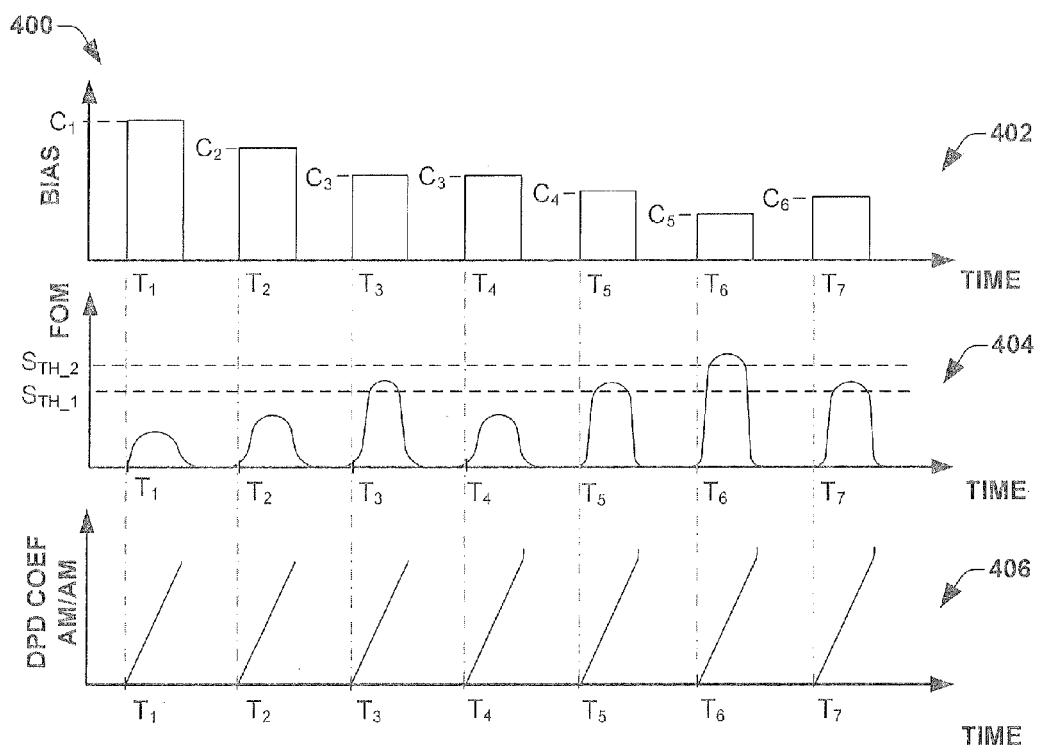
FIG. 4 illustrates signal diagrams showing the operation of a search algorithm configured to optimize the operating point of a transmission chain element for low current and good transmission quality using dynamic adaptive biasing and adaptive digital pre-distortion.

FIG. 4 illustrates signal diagrams 400 showing an exemplary search algorithm configured to optimize the operating point of a transmission chain element (e.g., power amplifier) for low current and good transmission quality using dynamic adaptive biasing and adaptive digital pre-distortion. The description of FIG. 4 utilizes the terms "actual merit" to refer to an actual "goodness" of a signal (e.g., linearity), "measured figure of merit" to refer to a numeric value calculated to correspond to a measured signal's "goodness", and "predetermined quality standard" to refer to a numeric threshold that the "measured figure of merit" may be compared with (note that a predetermined quality standard may not be compared to an actual merit, since an actual merit is not a numeric value).

To understand FIG. 4, it will be appreciated that the bias current of a power amplifier is directly proportionate to the current consumption of the power amplifier. Therefore, by increasing or decreasing the bias current of the power amplifier, the current consumption of the power amplifier can be increased or decreased. Also, the current consumption of a power amplifier is directly proportionate to the actual merit. Accordingly, as the current passing through a power amplifier increases, the actual merit of the signal gets better. Therefore, if an actual merit is above a minimum standard for transmission, the actual merit may be decreased causing the current consumption of a power amplifier to be decreased and the overall power consumption of the power amplifier to be decreased (as shown in FIG. 4, the actual merit is inversely proportional to the measured figure of merit; e.g., as the active area decreases and the current passing through a power amplifier decreases, the actual merit decreases but the measured figure of merit increases). Based upon these relationships, the algorithm attempts to incrementally decrease a power amplifier's current consumption (and therefore the overall power consumption of the transmission chain) while maintaining a measured figure of merit that is below a predetermined threshold value/target range (i.e., that has an actual merit that is above an actual merit corresponding to a minimum transmission standard that ensures good transmission).

At a first time, $T_1$ the bias current of a power amplifier is set to an initial value of $C_1$ (diagram 402), corresponding to a measured figure of merit (diagram 404) that is below the predetermined target range extending from $S_{TH\_1}$ to $S_{TH\_2}$ (e.g., that has an actual merit that is better than a minimum transmission standard), and the pre-distortion coefficients are set to a value that does not distort the output signal (diagram 406). Since the measured figure of merit is below the predetermined target range, the algorithm determines that it may decrease the bias current of the power amplifier.

At time $T_2$, the bias current of the power amplifier is incrementally reduced, causing a drop in the power amplifier's current consumption and an increase in the measured figure of merit. Since the measured figure of merit remains below the predetermined target range, the algorithm determines that it may further decrease the bias current of the power amplifier.

At time $T_3$, the bias current of the power amplifier is incrementally reduced causing a drop in the power amplifier's current consumption and an increase in the measured figure of merit. This increase in the measured figure of merit causes the measured figure of merit to go above a first predetermined threshold value $S_{TH\_1}$. Because the measured figure of merit is above the first predetermined threshold value $S_{TH\_1}$, at time $T_4$, the pre-distortion coefficients are calculated/updated to generate a distortion of the input signal, thereby removing non-linearities in the output signal and causing a reduction the measured figure of merit to a level that is below the predetermined threshold value $S_{TH}$. Therefore, since the measured figure of merit is between $S_{TH\_1}$ and $S_{TH\_2}$ the pre-distortion coefficients are updated to improve figure of merit while the adaptive biasing further reduces the current consumption (e.g., beyond what it would be capable of without pre-distortion).

At time $T_6$, if the measured figure of merit rises above the predetermined target range (e.g., above the second predetermined threshold value $S_{TH\_2}$) the algorithm determines that the actual merit is unacceptably low (e.g., too small of a margin to a transmission standard). In such a case, the operating point may be increased at time $T_7$, from $C_5$ to $C_6$, to increase the current consumption and reduce the measured figure of merit.

Therefore, as shown in FIG. 4, if the measured figure of merit is below the predetermined target range, the operating point/bias condition is reduced to increase the measured figure of merit. If the measured figure of merit is within a target range the pre-distortion coefficients are updated to remove non-linearities in the output signal. If the measured figure of merit is above than the target range, the operating point/bias condition is increased to reduce the measured figure of merit.

As described herein, the value of the measured figure of merit increases as the actual merit decreases. This inverse relationship between the measured figure of merit and the actual merit allows for the system to maintain a high transmitted actual merit by keeping the measured figure of merit below the predetermined threshold value $S_{TH}$. It will be appreciated that alternative measured figures of merit may also be used, such that the value of a measured figure of merit decreases as the actual merit decreases. Such alternative measured figures of merit would maintain a high actual merit by keeping the measured figure of merit above a predetermined threshold value.

Figure 5:
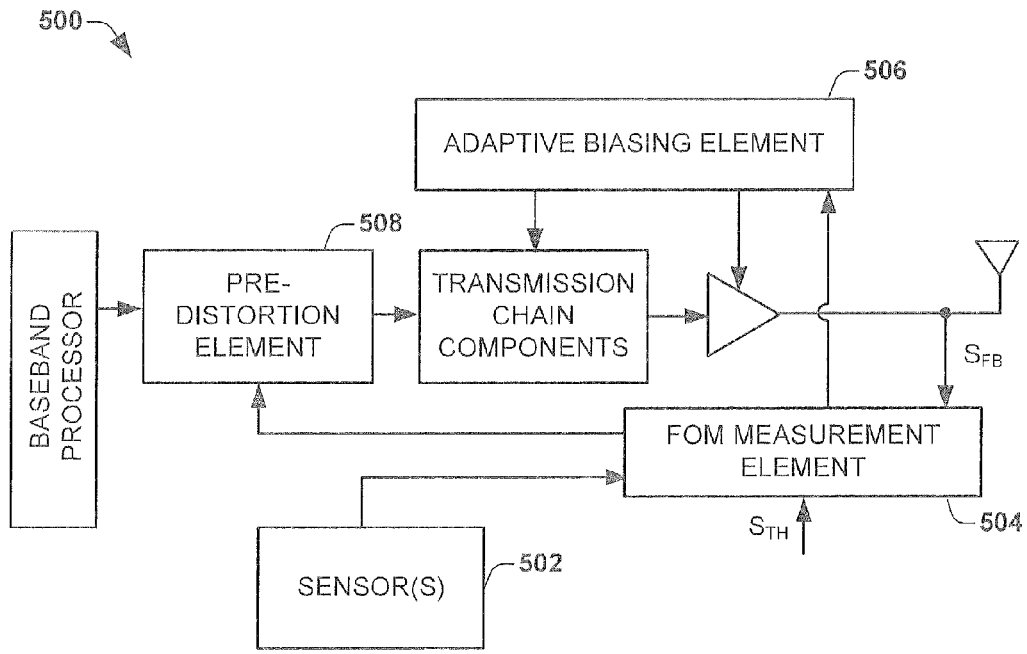
FIG. 5 illustrates an alternative embodiment of a transmission circuit, as provided herein, comprising additional sensors configured to measure external variables.

FIG. 5 illustrates an alternative embodiment of a transmission circuit, as provided herein, comprising additional sensors 502 configured to measure external variables. As shown in FIG. 5, the additional sensors 502 may be coupled to a figure of merit (FOM) measurement element 504 configured to provide a measured figure of merit to an adaptive biasing element 506 and a pre-distortion element 508. The additional sensors 502 may provide additional information (e.g., temperature, voltage, current, etc.) that may be used by the FOM measurement element 504 to determine a measured figure of merit.

In one embodiment, the additional sensors 502 may comprise sensors configured to sense environmental conditions such as temperature (e.g., a thermistor), for example. Knowing the environmental conditions makes it possible to adjust the operating point of a transmission chain element in a simpler and more effective way.

Furthermore, since the FOM measurement element 504 is configured to continuously evaluate the measured figure of merit, additional sensors 502 configured to sense environmental conditions may add additional information to the evaluation that allows the figure of merit measurement element 504 to incorporate changes due to environmental changes. This additional information allows the figure of merit measurement element 504 to maintain the system in an optimized state in light of changes that may occur due to environmental changes. Since changes in external variables may occur in a time frame which is longer than a slot time, the figure of merit measurement element 504 can follow changes adaptively, thereby allowing for saving of current and power.

In an additional embodiment, the additional sensors 502 may measure voltage and/or current passing through the transmission chain. The use of voltage and/or current sensors allows for the adjustment of voltage and/or current bias of one or more transmission chain elements.

Figure 6:
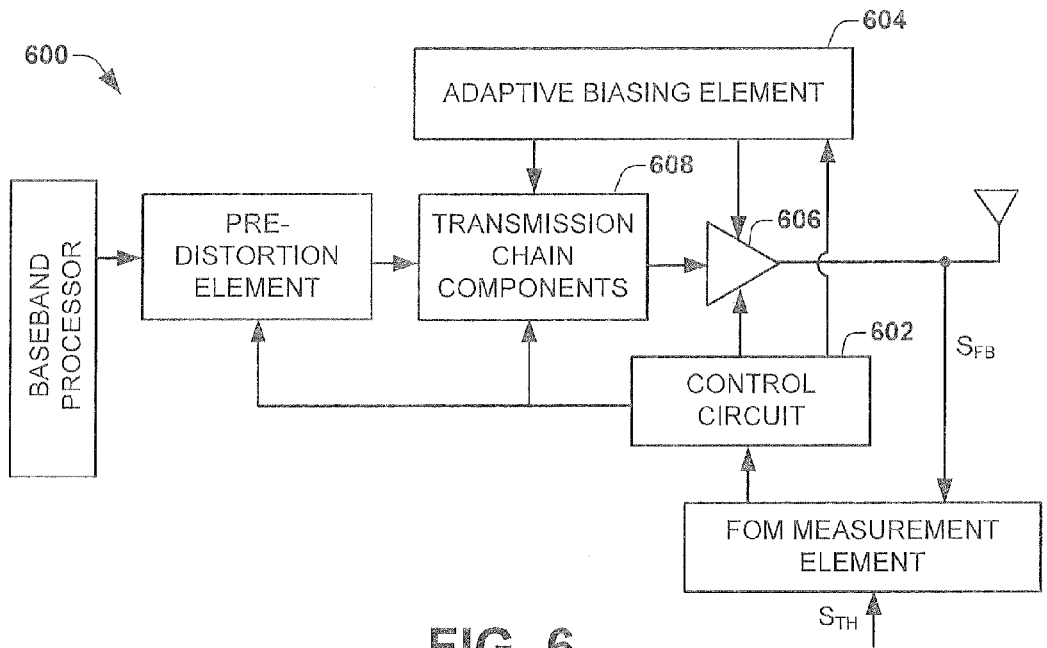
FIG. 6 illustrates an additional embodiment of a transmission circuit configured to optimize the power consumption of a transmission chain while maintaining an acceptable output figure of merit using adaptive biasing and digital pre-distortion.

FIG. 6 illustrates an additional embodiment of a transmission circuit 600 configured to adaptively reduce the power consumption of a transmission chain while maintaining an acceptable figure of merit. As shown in FIG. 6, the transmission circuit 600 may further comprise a control circuit 602. The control circuit may be configured to control a bias circuit 604 configured to provide a bias voltage or a bias current to power amplifier 606 and/or to other transmission chain components 608. The control circuit 602 may also be configured to adjust the active area of a power amplifier 606 to reduce the current consumption of the transmission chain.

In various embodiments, it is possible to optimize the active area adjustment technique, the DC/DC bias voltage adjustment technique, and/or the bias current adjustment technique alternatively (e.g., sequentially) in time. Therefore, the control circuit may provide for adaptive bias control in combination with adaptive active area control to provide for an improved overall optimization of the operating point of a power amplifier. In one embodiment, the bias voltage or a bias current may be set in accordance with the active area of the power amplifier 603.

Figure 7A:
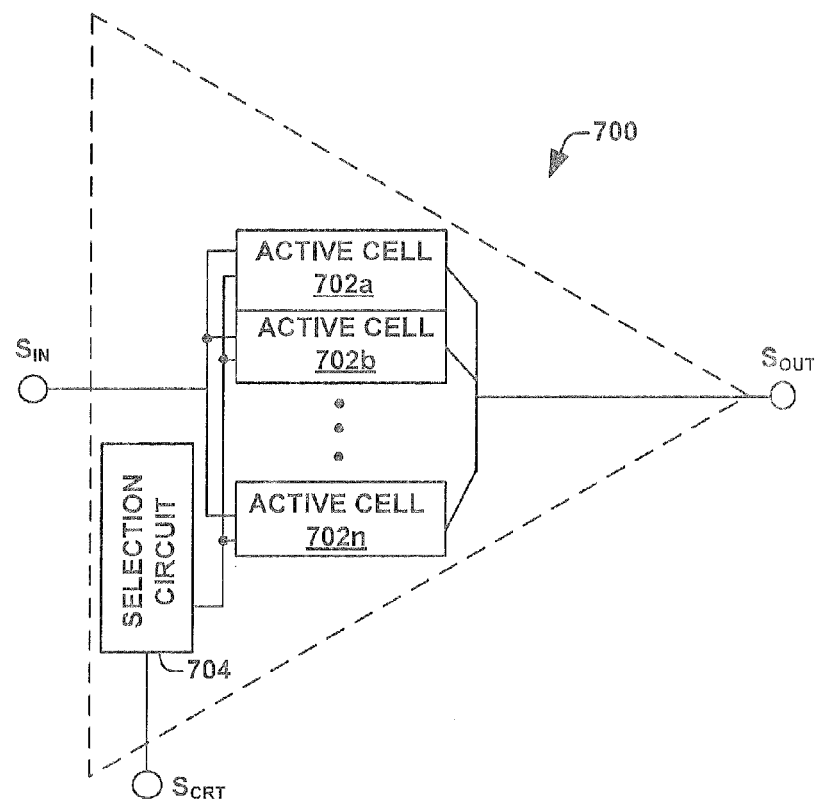
FIG. 7*a* illustrates a schematic diagram of a power amplifier, particularly illustrating transistor blocks that may be selectively operated to enable dynamical adjustment of the active area of the power amplifier.

FIG. 7*a* illustrates a schematic diagram of a power amplifier 700, particularly illustrating transistor blocks that may be selectively operated to enable dynamical adjustment of the active area of the power amplifier 700. The schematic diagram is a simplification of a power amplifier to aid in understanding the present invention and is not intended in a limiting manner or to illustrate all technical components of a power amplifier. One skilled in the art will appreciate that power amplifiers usually comprise a matrix of transistors (or different blocks of transistors combined together). As shown in FIG. 7*a*, a power amplifier may comprise a plurality of active cells 702*a*-702*n*. Respective active cells 702*x* may correspond to a single transistor or block of transistors (e.g., rows or columns of a transistor matrix) that may be selectively operated.

The active area of the power amplifier 700 can be adjusted by adjusting the number of active cells 702*x* in the power amplifier architecture. As shown in FIG. 7*a*, respective active cells 702*x* can be switched on or off to increase or decrease the active area of the power amplifier. Switching the active cells 702*x* on and off may be done through using a variety of different methods. The selective operation of the active cells may be done through use of a control signal (e.g., control-voltage, bit streaming, control word, etc.), for example. In one embodiment, a control signal $S_{CRTL}$ comprising a control word is provided to a selection circuit 704. Based upon the received control word, the selection circuit 704 sends an activation signal to selected active cell transistor gates, causing the active cell transistors to turn on and thereby increase the overall active area of the power amplifier. In alternative embodiments, the selection circuit 704 can provide a signal to a plurality of diodes configured to connect and disconnect the input and output paths when switched on and off.

Figure 7B:
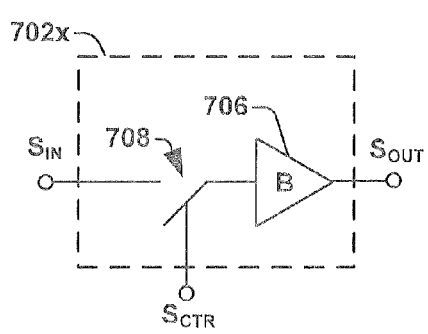
FIGS. 7*b*-7*c* different embodiments of power amplifier transistor block that may be selectively activated to enable dynamical adjustment of the active area of the power amplifier.
Figure 7C:
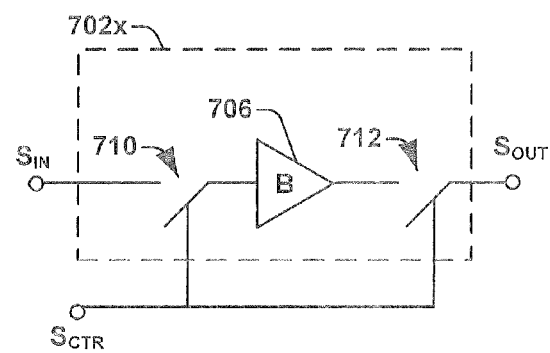

The active cells can be dynamically switched on or off which increase or decrease the active area. As shown in FIG. 7*a*, the overall active area of the power amplifier will be adjusted based on a selected number of active cells. For example, if active cells 702*a*, 702*b*, 702*c*, and 702*d* are selected, the power amplifier will have an active area that results in a first current consumption by the power amplifier. However, if active cells 702*a* and 702*b* are selected, the power amplifier will have a smaller active area that results in a second current consumption, smaller than the first current consumption, by the power amplifier FIGS. 7*b* and 7*c* are non-limiting examples of more detailed circuitry that may be used to selectively activate a transistor block (i.e., active cell comprising one or more transistors) comprised within an active cell of a power amplifier. The active cell may comprise a plurality of inputs that are utilized to enable selective operation of a transistor block.

FIG. 7*b* illustrates an embodiment of an active cell having a switching mechanism 708 disposed upstream of (i.e., prior to) the transistor block 706. The switching mechanism 708 may be controlled by a control signal $S_{CTR}$ and is configured to couple or decouple the transistor block 706 from the power amplifier. For example, if the control signal closes the switching mechanism 708, the transistor block 706 will be coupled to the power amplifier increasing the active area of the power amplifier. In contrast, if the control signal opens the switching mechanism 708 the transistor block 706 will be decoupled to the power amplifier decreasing the active area of the power amplifier.

FIG. 7*c* illustrates an alternative embodiment of an active cell having a first switching mechanism 710 disposed upstream to the transistor block 706 and a second switching mechanism 712 disposed downstream of the transistor block 706. The switching mechanisms 710 and 712 may be controlled by a control signal $S_{CTR}$ to couple or decouple the transistor block 706 from the power amplifier.

Figure 8:
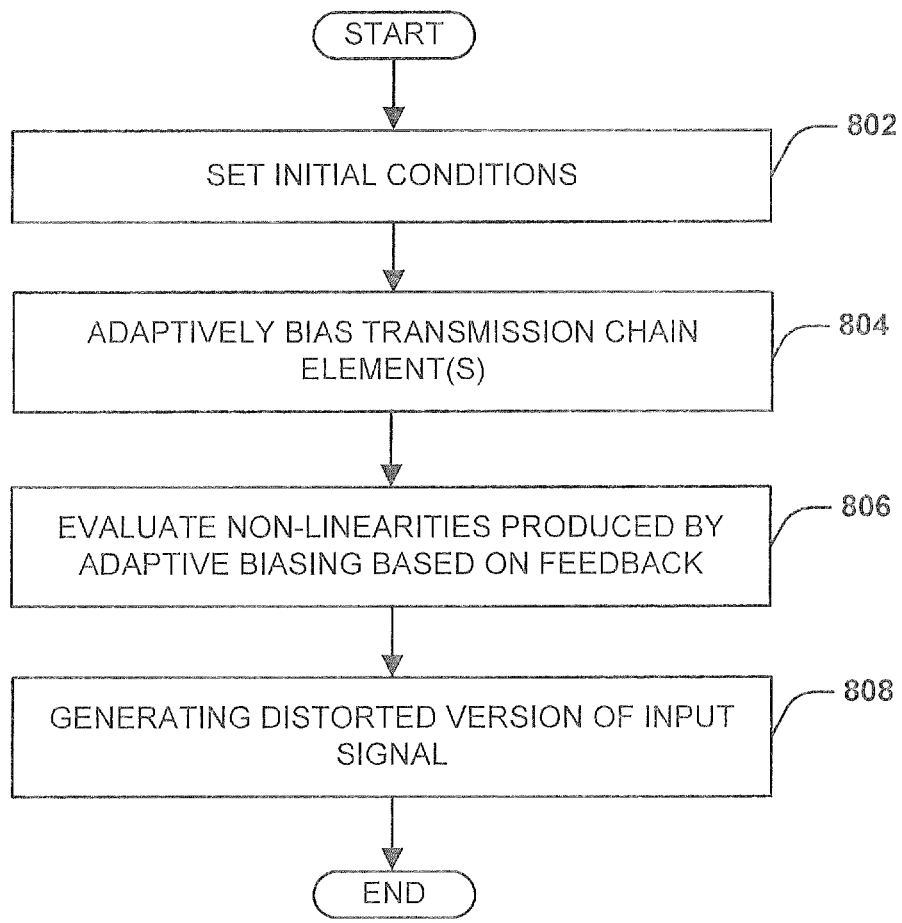
FIG. 8 illustrates a flow diagram of a first exemplary method for dynamically reducing current consumption of a transmission chain in a stepwise manner.
Figure 9:
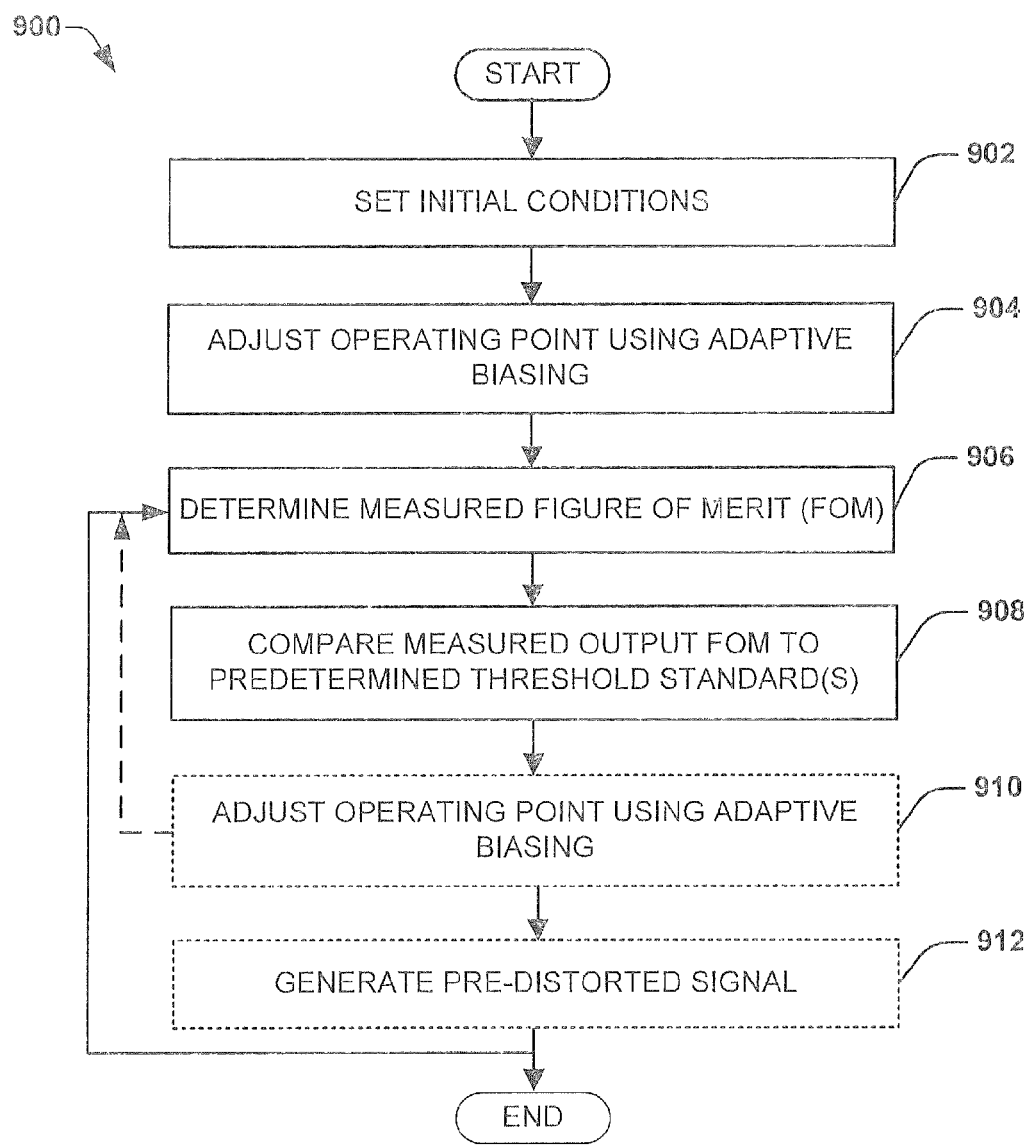
FIG. 9 illustrates a flow diagram of a more detailed exemplary method for dynamically reducing current consumption of a transmission chain in a stepwise manner.
Figure 11:
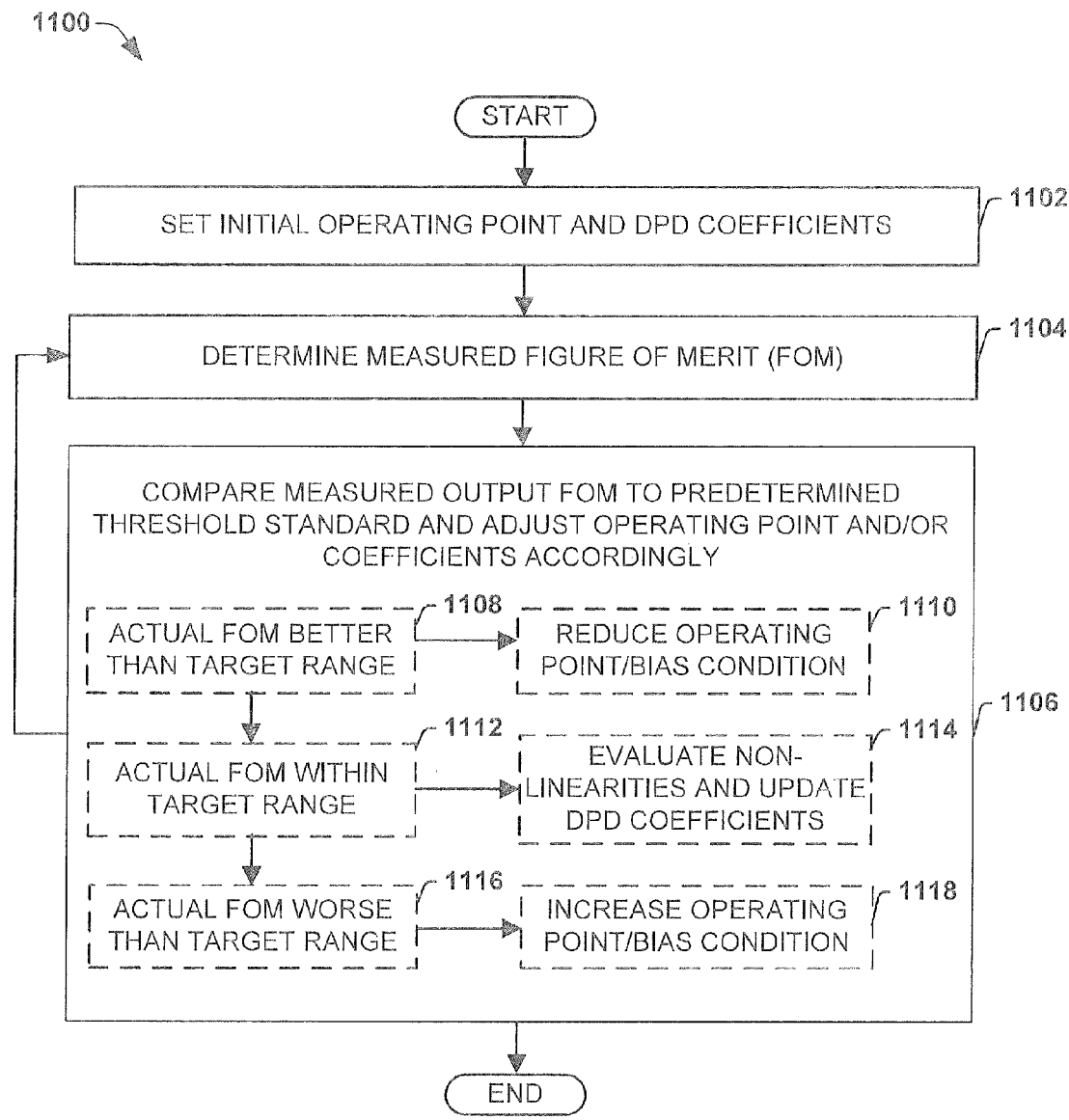
FIG. 11 illustrates a flow diagram of a more detailed exemplary method for dynamically reducing current consumption of a transmission chain in a stepwise manner.

FIGS. 8, 9, and 11 illustrate flow diagrams of exemplary methods for dynamically reducing current consumption of a transmission chain in a stepwise manner.

While methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1, 2, etc., are non-limiting examples of circuits that may be used to implement methods 800, 900, or 1100). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

FIG. 8 illustrates a flow diagram of an exemplary method 800 for dynamically reducing current consumption of a transmission chain in a stepwise manner.

At 802 initial operating conditions are set. In one embodiment, the initial conditions are set to provide a transmission chain operating point that guarantees good linearity and pre-distortion coefficients that do not pre-distort the output wave.

At 804 one or more transmission chain elements are adaptively biased to reduce the current consumption the elements. Adaptively biasing the one or more transmission chain elements produce non-linearities in an output signal.

At 806 the non-linearities produced by the adaptive biasing are evaluated. Evaluation of the non-linearities may be performed based upon a feedback signal comprising information (e.g., amplitude, phase, etc.) about the adaptively biased signal. In one embodiment, evaluating the non-linearities produced by the adaptive biasing comprises generating a measured figure of merit by analyzing a crest factor of the feedback signal and comparing it to a crest factor of the input signal.

At 808 a distorted version of the signal input to the transmission chain is generated to account for non-linearities caused by adaptively biasing the one or more transmission chain elements. The distorted version of the signal may be generated through adaptive digital pre-distortion techniques, wherein one or more pre-distortion coefficients are updated to account for non-linearities introduced by the adaptive biasing.

Figure 10:
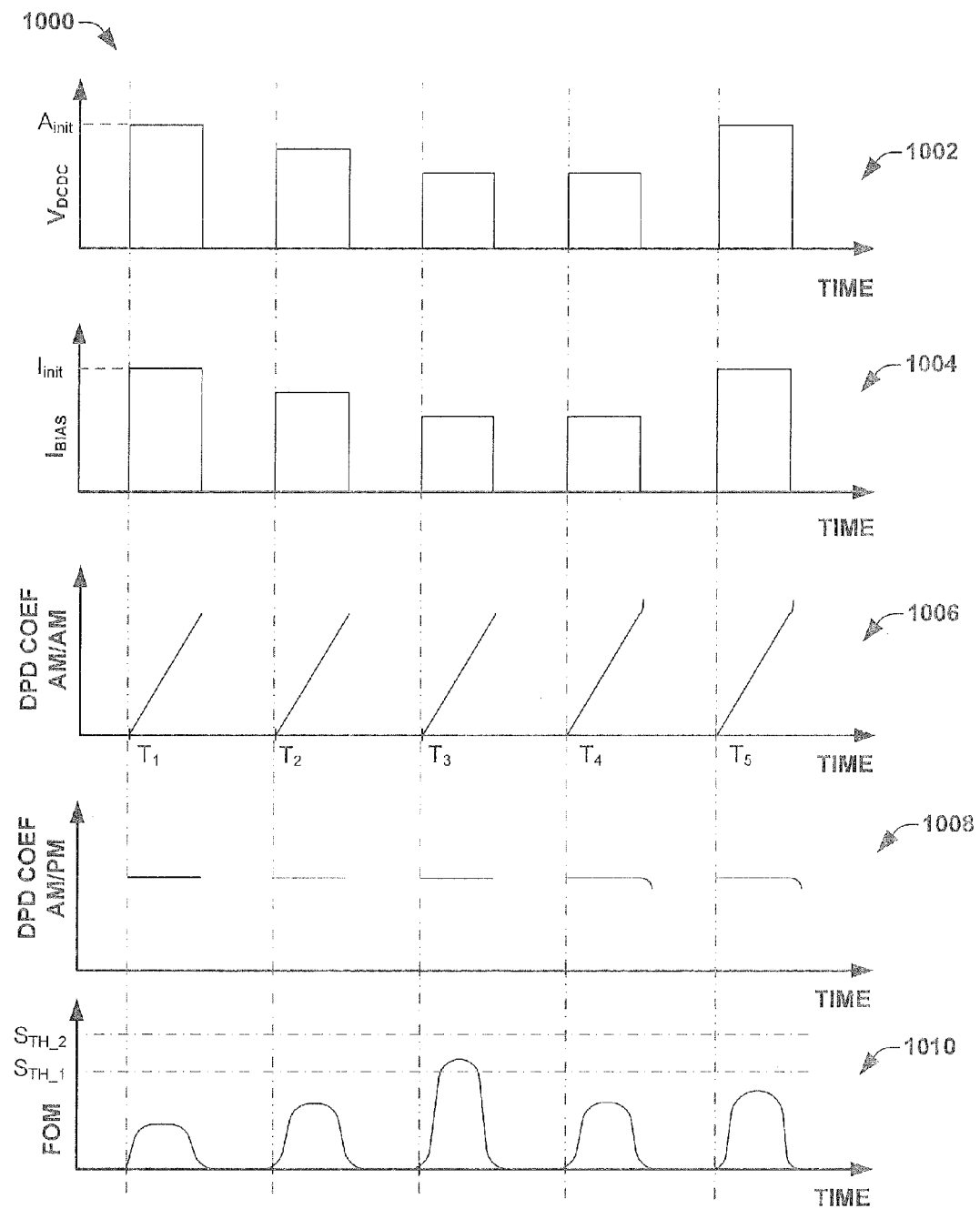
FIG. 10 illustrates signal diagrams of an exemplary power amplifier to aid in understanding the steps of the method of FIG. 9.

FIG. 9 illustrates a flow diagram of an exemplary method 800 for dynamically reducing current consumption of a transmission chain in a stepwise manner. FIG. 10 illustrates signal diagrams of an exemplary power amplifier to aid in understanding the steps of method 800. It will be appreciated that although FIG. 10 illustrates graphs of both collector voltage $V_{DCDC}$ (graph 1002) and biasing current $I_{BIAS}$ (graph 1004) being reduced that in various embodiments $V_{DCDC}$ and/or $I_{BIAS}$ may actually be varied as shown in the graphs. Similarly, although FIG. 10 illustrates graphs of both amplitude pre-distortion (AM/AM) coefficients (graph 1006) and/or phase pre-distortion (AM/PM) coefficients (graph 1008) in various embodiments AM/AM and/or AM/PM coefficients may be varied.

At 902 an initial conditions of a transmission chain are set. In one embodiment, at the beginning of a new transmission, the operating point of a transmission chain element is set high enough to guarantee good linearity for the output power of the transmission chain. The safety threshold may be set at a level which results in an output signal having a voltage standing wave ratio of up to 4:1, taking into consideration temperature variations, process variations, etc. Furthermore, pre-distortion coefficients may be set so that a DPD is not pre-distorting the output wave.

For example, as shown in FIG. 10, at time $T_1$ collector voltage $V_{DCDC}$ (graph 1002) and/or biasing current $I_{BIAS}$ (graph 1004) are respectively set to initial values of $A_{init}$ and $I_{init}$, corresponding to a measured figure of merit (FOM) (graph 1010) that is below a first predetermined threshold value $S_{TH\_1}$. Amplitude pre-distortion (AM/AM) coefficients (graph 906) and/or phase pre-distortion (AM/PM) coefficients (graph 1008) are set to initial values that do not cause distortion of the output wave.

The operating point is adjusted by adaptive biasing at 904. Adjustment of the operating point by adaptive biasing may comprise decreasing collector voltage of transmission chain elements, the bias current of transmission chain elements, and/or the active area of a power amplifier, for example. Adjustment of the operating point causes a small drop in the collector current passing through the power amplifier (i.e., and an overall power consumption of the transmission chain), resulting in an incremental increase in the measured figure of merit (i.e., and an incremental decrease in the actual merit).

As shown in FIG. 10, the collector voltage $V_{DCDC}$ (graph 1002) is decreased from time $T_1$ to time $T_2$. Alternatively or additionally, the biasing current $I_{BIAS}$ (graph 1004) may be decreased from time $T_1$ to time $T_2$. Decreasing $V_{DCDC}$ and/or $I_{BIAS}$ results in an increase in the measured figure of merit (graph 1010, time $T_2$).

At 906 a measured figure of merit of the output signal is determined. Determining the measured figure of merit of the output signal may be done by measuring parameters of the output signal such as amplitude and/or phase. The parameters may then be evaluated to generate a numeric measured figure of merit. One skilled in the art will appreciate that the measured figure of merit of the output signal may be measured according to a wide variety of methods. Method 900 is intended to encompass any method of measuring the actual merit (e.g., "goodness") of the output signal. In one exemplary embodiment, the measured figure of merit of the output signal may be determined directly, by comparing a demodulated RF feedback signal with a reference signal. In an alternative exemplary embodiment, the measured figure of merit of the output signal may be determined indirectly, by evaluating the AM/AM and AM/PM distortion introduced by the power amplifier. In yet another exemplary embodiment, the adjacent channel leakage ratio (ACLR) can be measured and used as an indicator of the figure of merit (e.g., a low ACLR indicates a high figure of merit and a high ACLR indicates a low figure of merit).

The measured figure of merit of the output signal is compared to a predetermined quality standard at 908. In one embodiment, the predetermined quality standard may comprise a first predetermined threshold value $S_{TH\_1}$. In one embodiment, if the measured figure of merit violates the first predetermined threshold value (e.g., is above the first predetermined threshold value) pre-distortion may be performed to distort the incoming signal and improve the actual merit (e.g., reduce the measured figure of merit) while adaptive biasing continues to operate to reduce the current consumption (e.g., figure of merit). In an additional embodiment, the predetermined quality standard may further comprise a second predetermined threshold value $S_{TH\_2}$. In one embodiment, if the measured figure of merit violates the second predetermined threshold value (e.g., is above the second predetermined threshold value) the adaptive biasing will operate to dynamically improve the actual merit (e.g., reduce the measured figure of merit). Therefore, the first and second predetermined threshold values $S_{TH\_1}$, $S_{TH\_2}$ collectively comprise a predetermined target range that defines a range of actual merit extending from $S_{TH\_1}$ to $S_{TH\_2}$.

At 910, the operating point may be further adjusted by adaptive biasing.

At 912, the pre-distortion coefficients are calculated to generate a pre-distortion in the input signal removing non-linearities in the output signal and causing a reduction the measured figure of merit to a level that is below the first predetermined threshold value $S_{TH\_1}$, without increasing the current or bias voltage. In an embodiment, the pre-distortion coefficients may be updated when the figure of merit violates the first predetermined threshold value $S_{TH\_1}$, but the adaptive biasing will not be used to improve the figure of merit until the figure of merit violates the second predetermined threshold value $S_{TH\_2}$.

As shown in FIG. 10, in one embodiment when the measured figure of merit (FOM) at time $T_3$ is above the first predetermined threshold value $S_{TH\_1}$ (step 908) the pre-distortion coefficients are calculated at time $T_4$ to generate a pre-distortion in the input signal removing non-linearities in the output signal and causing a reduction the measured figure of merit to a level that is below the first predetermined threshold value $S_{TH\_1}$, without increasing the current or bias voltage.

Method 900 may be iteratively performed to reduce the operating point based upon comparisons between a measured figure of merit and one or more predetermined threshold values (step 908). As explained in relation to FIG. 1 (See, supra, par. [0026]-[0028]), various iterations may comprise act 910 and/or act 912.

FIG. 11 illustrates a flow diagram of a more detailed embodiment of a method for dynamically reducing current consumption of a transmission chain in a stepwise manner.

At 1102 an initial operating point of a transmission chain element is set. In one embodiment, at the beginning of a new transmission, the operating point of a transmission chain element is set high enough to guarantee good linearity for the output power of the transmission chain while the pre-distortion coefficients are set so as to not distort an input signal to the transmission chain.

At 1104 a measured figure of merit is determined.

At 1106, the measured figure of merit is compared to a predetermined quality standard and the transmission chain element is adjusted accordingly. In one embodiment, the predetermined quality standard comprises a predetermined target range. If the actual merit is better than the predetermined target range (1108), the operating point/bias condition is reduced (1110) to reduce the current consumption (and figure of merit). If the actual merit is within a target range (1112) the pre-distortion coefficients are updated (1114) to remove non-linearities in the output signal. If the actual merit is worse than the target range (1116), the operating point/bias condition is increased (1118) to increase the current consumption (and figure of merit).

It will be appreciated that the term amplifier, as referred to in this disclosure and shown in the associated figures is meant to encompass one or more amplifiers. For example, an amplifier may refer to more than one transistor amplifier consisting of several stages with matching networks. The inventors have contemplated the use of the disclosed invention with the use of a wide variety of amplifiers. Furthermore, although the examples provided herein are described in regards transmitter circuits, it will be appreciated that the invention may be broadly applied to different transceiver and/or transmitter architectures.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transmitter circuit, comprising:
one or more transmission chain elements configured to receive an input signal and to generate an output signal;
a figure of merit measurement element configured to receive information about the output signal from a feedback loop, extending from the one or more transmission chain elements to the figure of merit measurement element, and to determine a measured figure of merit of the output signal;
an adaptive biasing element configured to adaptively bias the one or more transmission chain elements to iteratively reduce a current consumption of the one or more transmission chain elements until the measured figure of merit violates a predetermined quality standard; and
a pre-distortion element located upstream of the one or more transmission chain elements and configured to generate a distorted input signal to improve the measured figure of merit and thus account for non-linearities introduced into the output signal during the adaptive biasing, until the measured figure of merit no longer violates the predetermined quality standard.

2. The transmitter circuit of claim 1, wherein the pre-distortion element is configured to generate the distorted version of the input signal when the measured figure of merit violates a first predetermined threshold value.

3. The transmitter circuit of claim 1, wherein the adaptive biasing element and the pre-distortion element are configure to operate within a time slot.

4. The transmission chain element of claim 1, wherein adaptively biasing the one or more transmission chain elements comprises dynamically adjusting a bias condition comprising one or more of: a bias voltage or a bias current of the one or more transmission chain elements.

5. A transmitter circuit, comprising:
one or more transmission chain elements configured to receive an input signal and to generate an output signal;
a figure of merit measurement element configured to receive information about the output signal from a feedback loop, extending from the one or more transmission chain elements to the figure of merit measurement element, and to determine a measured figure of merit of the output signal;
an adaptive biasing element configured to adaptively bias the one or more transmission chain elements to iteratively adjusting a current consumption of the one or more transmission chain elements; and
a pre-distortion element located upstream of the one or more transmission chain elements and configured to generate a distorted input signal to account for non-linearities introduced into the output signal during the adaptive biasing,
wherein the measured figure of merit is evaluated against a predetermined target range that defines a range of actual merit,
wherein if the measured figure of merit indicates that the actual merit is better than that defined by the predetermined target range, the adaptive biasing element is configured to reduce the current consumption and the actual merit in a stepwise manner, wherein if the measured figure of merit indicates that the actual merit is within the predetermined target range, the non-linearities introduced by the adaptive biasing are evaluated and one or more pre-distortion coefficients used by the pre-distortion element to generate the distorted input signal are updated, and wherein if the measured figure of merit indicates that the actual merit is worse than that defined by the predetermined target range, the adaptive biasing element is configured to increase the current consumption and the actual merit.

6. The transmitter of claim 5, wherein the pre-distortion coefficients comprise amplitude distortion coefficients (AM/AM) coefficients.

7. The transmitter of claim 5, wherein the pre-distortion coefficients comprise phase distortion coefficients (AM/PM) coefficients.

8. The transmitter circuit of claim 1, further comprising one or more additional sensor coupled to the figure of merit measurement element, wherein the one or more additional sensors are configured to measure external variables used to assist determining the measured figure of merit.

9. The transmitter of claim 1, wherein the adaptive biasing element is configured to initially operate to guarantee good linearity for an output power and wherein the pre-distortion element is configured to initially operate so as to not distort the output signal.

10. A method for reducing a current consumption of a transmission circuit, comprising:
adaptively biasing one or more transmission chain elements to reduce the current consumption of the one or more transmission chain elements, wherein adaptively biasing the one or more transmission chain elements produces non-linearities in an output signal;
evaluating the non-linearities based upon a feedback signal comprising information about the output signal; and
generating a distorted input signal, input to the one or more transmission chain elements, having distortions to account for non-linearities caused by adaptively biasing the one or more transmission chain elements,
wherein the measured figure of merit is evaluated against a predetermined target range that defines a range of actual merit,
wherein if the measured figure of merit indicates that the actual merit is better than that defined by the predetermined target range, the one or more transmission chain elements are adaptively biased to reduce the current consumption in a stepwise manner, thereby reducing the measured figure of merit,
wherein if the measured figure of merit indicates that the actual merit is within the predetermined target range, the non-linearities introduced by the adaptive biasing are evaluated and one or more pre-distortion coefficients used by to generate the distorted input signal are updated, and
wherein if the measured figure of merit indicates that the actual merit is worse than that defined by the predetermined target range, the one or more transmission chain elements are adaptively biased to increase the current consumption, thereby increasing the actual merit; and
wherein a value of the measured figure of merit is used to update the adaptive biasing of the one or more digital pre-distortion coefficients based upon one or more mathematical relationships, the mathematical relationships including parameters derived from one or more additional sensors configured to measure external variables including those used to assist determining the measured figure of merit.

11. The method of claim 10, wherein evaluating the non-linearities produced by the adaptive biasing comprises generating a measured figure of merit by analyzing a crest factor of the feedback signal and comparing it to a crest factor of the input signal.

12. The method of claim 10, wherein generating a distorted version of an input signal comprises updating one or more pre-distortion coefficients, which are applied to the input signal.

13. The method of claim 12, wherein the pre-distortion coefficients comprise amplitude distortion coefficients (AM/AM) coefficients or phase distortion coefficients (AM/PM) coefficients.

14. The method of claim 12, wherein an adaptive biasing working point is initially set high enough to guarantee good linearity for the output signal and wherein the one or more pre-distortion coefficients are initially set so as to not distort the input signal.

15. A method for reducing a current consumption of one or more transmission chain elements, comprising:
setting initial bias conditions of one or more transmission chain elements high enough to guarantee good linearity for an output signal and one or more initial pre-distortion coefficients so as to not distort an input signal,
determining a measured figure of merit of the output signal; and
alternatively or concurrently performing adaptive biasing and updating the pre-distortion coefficients in a stepwise iterative process based on the measured figure of merit,
wherein the measured figure of merit is evaluated against a predetermined target range that defines a range of actual merit,
wherein if the measured figure of merit indicates that the actual merit is better than that defined by the predetermined target range, adaptive biasing is performed to reduce the current consumption and the actual merit in a stepwise manner,
wherein if the measured figure of merit indicates that the actual merit is within the predetermined target range, non-linearities introduced by adjusting the bias conditions are evaluated and one or more pre-distortion coefficients are updated, and
wherein if the measured figure of merit indicates that the actual merit is worse than that defined by the predetermined target range, adaptive biasing is performed to increase the current consumption and actual merit.

16. The method of claim 15, wherein adaptively biasing the one or more transmission chain elements comprises dynamically adjusting a bias condition comprising one or more of: a bias voltage or a bias current of the one or more transmission chain elements.

17. The method of claim 15, wherein an adaptive biasing working point is initially set high enough to guarantee good linearity for the output signal and wherein the one or more pre-distortion coefficients are initially set so as to not distort the input signal.

18. The method of claim 15, wherein the pre-distortion coefficients comprise amplitude distortion coefficients (AM/AM) coefficients or phase distortion coefficients (AM/PM) coefficients.

* * * * *